United States Patent
Shin et al.

(10) Patent No.: US 9,698,666 B2
(45) Date of Patent: Jul. 4, 2017

(54) POWER SUPPLY AND GATE DRIVER THEREIN

(71) Applicants: Samsung Electronics Co., Ltd., Suwon-si (KR); SNU R&DB FOUNDATION, Seoul (KR)

(72) Inventors: Jong Hyun Shin, Seoul (KR); Jaeha Kim, Seoul (KR); Hyun Soo Park, Seoul (KR); Jung-Ik Ha, Seoul (KR); Taewook Kang, Seoul (KR)

(73) Assignees: SAMSUNG ELECTRONICS CO., LTD., Suwon-si (KR); SNU R&DB FOUNDATION, Seoul (KR)

( * ) Notice: Subject to any disclaimer, the term of this patent is extended or adjusted under 35 U.S.C. 154(b) by 196 days.

(21) Appl. No.: 14/564,679

(22) Filed: Dec. 9, 2014

(65) Prior Publication Data
US 2015/0188404 A1 Jul. 2, 2015

(30) Foreign Application Priority Data
Dec. 30, 2013 (KR) .................. 10-2013-0166583

(51) Int. Cl.
*G05F 1/00* (2006.01)
*H02M 1/08* (2006.01)
(Continued)

(52) U.S. Cl.
CPC ............ *H02M 1/08* (2013.01); *H02M 3/156* (2013.01); *H03K 17/168* (2013.01);
(Continued)

(58) Field of Classification Search
CPC ..... H02M 3/156; H02M 3/158; H02M 3/1588
(Continued)

(56) References Cited

U.S. PATENT DOCUMENTS

| 6,107,860 A * | 8/2000 | Vinciarelli ........... H03K 17/691 |
| | | 327/109 |
| 2006/0013022 A1* | 1/2006 | Jitaru ..................... H02M 1/38 |
| | | 363/21.12 |

FOREIGN PATENT DOCUMENTS

| WO | 93/12581 | 6/1993 |
| WO | 03/088465 | 10/2003 |

OTHER PUBLICATIONS

Extended European Search Report dated Jun. 9, 2015 in European Patent Application No. 14198550.7.
(Continued)

*Primary Examiner* — Adolf Berhane
*Assistant Examiner* — Afework Demisse
(74) *Attorney, Agent, or Firm* — Staas & Halsey LLP

(57) ABSTRACT

A power supply and a gate driver includes a power switching element to control current, a control circuit to output a control signal for opening or closing of the power switching element, and a gate drive circuit to open or close the power switching element in accordance with the control signal. The gate drive circuit includes a first inductive circuit connected to a supply voltage source, and a second inductive circuit connected to an input stage of the power switching element, and transfers electrical energy stored in the input stage of the power switching element, using the first and second inductive circuits. Accordingly, electrical energy supplied to the input stage of the power switching element during an ON state of the power switching element is again recovered during an OFF state of the power switching element.

22 Claims, 15 Drawing Sheets

(51) Int. Cl.
*H02M 3/156* (2006.01)
*H03K 17/691* (2006.01)
*H03K 17/16* (2006.01)
*H02M 1/00* (2006.01)

(52) U.S. Cl.
CPC ... *H03K 17/691* (2013.01); *H02M 2001/0054* (2013.01); *H03K 2217/0036* (2013.01)

(58) Field of Classification Search
USPC ................................ 323/282–286; 363/21.12
See application file for complete search history.

(56) References Cited

OTHER PUBLICATIONS

Powerex, Inc. "VLA500K-01 R, Hybrid IC IGBT Gate Driver + DC/DC Converter", XP055192449, May 2007, pp. 1-6.

\* cited by examiner (a)                    (b)

(a)          (b)

(a)  (b)

POWER SUPPLY AND GATE DRIVER THEREIN

CROSS-REFERENCE TO RELATED APPLICATIONS

This application claims the priority benefit of Korean Patent Application No. 10-2013-0166583 filed on Dec. 30, 2013 in the Korean Intellectual Property Office, the disclosure of which is incorporated herein by reference.

BACKGROUND

1. Field

The following description relates to a power supply capable of achieving a reduction in switching loss, and a gate driver included therein.

2. Description of the Related Art

An energy conversion device included in a power supply, for example, a DC-DC converter or an electric motor, performs energy conversion while switching on/off power switching elements. However, a circuit to control such an energy conversion device exhibits weak current drivability because the circuit is a logical operation circuit. On the other hand, power switching elements require high energy when they are switched on/off and, as such, cannot directly receive a control signal from the logical operation circuit, which exhibits weak drivability. To this end, such a power switching element receives a control signal from the logical operation circuit via a gate driver which is a kind of buffers.

In the case of a power switching element such as an insulated gate bipolar transistor or a power field effect transistor exhibits switching loss upon switching operation thereof because the input impedance thereof mainly includes a capacitance component.

Switching loss of such a power switching element depends on the quantity of charge to be charged or discharged for driving of the power switching element, the supply voltage of the gate driver, and the switching frequency of the power switching element.

Meanwhile, recent energy conversion devices have a tendency toward an increase in switching frequency and, as such, exhibit an increased rate of switching loss in the total loss thereof. In particular, in the case of an energy conversion device exhibiting low power consumption, the switching loss rate thereof is further increased.

SUMMARY

Therefore, it is an aspect of the present disclosure to provide a power supply capable of recovering, upon turning off a power switching element, electrical energy supplied to an input stage of the power switching element upon turning on the power switching element, and a gate driver included in the power supply.

Additional aspects of the disclosure will be set forth in part in the description which follows and, in part, will be obvious from the description, or may be learned by practice of the disclosure.

In accordance with an aspect of the present disclosure, a power supply includes a power switching element, a control circuit to output a control signal for opening or closing the power switching element, and a gate drive circuit to open or close the power switching element in accordance with the control signal, wherein the gate drive circuit includes a first inductive circuit connected to a supply voltage source, and a second inductive circuit connected to an input stage of the power switching element, and transfers electrical energy stored in the input stage of the power switching element, using the first and second inductive circuits.

In an embodiment of the present disclosure, the gate drive circuit may transfer electrical energy from the supply voltage source to the input stage of the power switching element, using the first and second inductive circuits.

In an embodiment of the present disclosure, the gate drive circuit may further include a first switching circuit to control current flowing through the first inductive circuit, and a second switching circuit to control current flowing through the second inductive circuit.

In an embodiment of the present disclosure, the gate drive circuit may adjust ON durations of the first and second switching circuits, to adjust an energy transfer time for the energy transfer between the input stage of the power switching element and the supply voltage source.

In an embodiment of the present disclosure, the gate drive circuit may turn on the second switching circuit after turning on the first switching circuit, for increasing a voltage at the input stage of the power switching element.

In an embodiment of the present disclosure, the gate drive circuit may increase an ON-duration duty ratio of the first switching circuit in accordance with the increase of the input stage voltage of the power switching element.

In an embodiment of the present disclosure, the gate drive circuit may decrease an ON-duration duty ratio of the second switching circuit in accordance with the increase of the input stage voltage of the power switching element.

In an embodiment of the present disclosure, the gate drive circuit may turn on the first switching circuit after turning on the second switching circuit, for decreasing a voltage at the input stage of the power switching element.

In an embodiment of the present disclosure, the gate drive circuit may increase an ON-duration duty ratio of the second switching circuit in accordance with the decrease of the input stage voltage of the power switching element.

In an embodiment of the present disclosure, the gate drive circuit may decrease an ON-duration duty ratio of the first switching circuit in accordance with the decrease of the input stage voltage of the power switching element.

In an embodiment of the present disclosure, the gate drive circuit may further include a switching signal generator to generate a first switching signal for opening or closing of the first switching circuit and a second switching signal for opening or closing of the second switching circuit in accordance with the control signal.

In an embodiment of the present disclosure, the switching signal generator may output a second switching signal for turning-on of the second switching circuit after outputting a first switching signal for turning-on of the first switching circuit, upon receiving an ON signal for the power switching element.

In an embodiment of the present disclosure, the switching signal generator may reduce an ON duration of the second switching signal in accordance with the increase of the input stage voltage of the power switching element.

In an embodiment of the present disclosure, the switching signal generator may output a first switching signal for turning-on of the first switching circuit after outputting a second switching signal for turning-on of the second switching circuit, upon receiving an OFF signal for the power switching element.

In an embodiment of the present disclosure, the switching signal generator may increase an ON duration of the second switching signal in accordance with the decrease of the input stage voltage of the power switching element.

In accordance with an aspect of the present disclosure, a gate driver for opening or closing a power switching element includes a first inductive circuit connected to a supply voltage source, a second inductive circuit connected to an input stage of the power switching element, a switching circuit to control current flowing through the first and second inductive circuits, and a switching signal generator to control the switching circuit, for transfer of electrical energy stored in the input stage of the power switching element to the supply voltage source using the first and second inductive circuits.

In an embodiment of the present disclosure, the switching signal generator may control the switching circuit, for transfer of electrical energy from the supply voltage source to the input stage of the power switching circuit using the first and second inductive circuits.

In an embodiment of the present disclosure, the switching circuit may include a first switching circuit to control current flowing through the first inductive circuit, and a second switching circuit to control current flowing through the second inductive circuit.

In an embodiment of the present disclosure, the switching signal generator may adjust ON durations of the first and second switching circuits, to adjust an energy transfer time for the energy transfer between the input stage of the power switching element and the supply voltage source.

In an embodiment of the present disclosure, the switching signal generator may output a second switching signal for turning-on of the second switching circuit after outputting a first switching signal for turning-on of the first switching circuit, upon receiving an ON signal for the power switching element.

In an embodiment of the present disclosure, the switching signal generator may reduce an ON duration of the second switching signal in accordance with the increase of the input stage voltage of the power switching element.

In an embodiment of the present disclosure, the switching signal generator may output a first switching signal for turning-on of the first switching circuit after outputting a second switching signal for turning-on of the second switching circuit, upon receiving an OFF signal for the power switching element.

In an embodiment of the present disclosure, the switching signal generator may increase an ON duration of the second switching signal in accordance with the decrease of the input stage voltage of the power switching element.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Reference will now be made in detail to the preferred embodiments of the present disclosure, examples of which are illustrated in the accompanying drawings. Of course, various modifications and variations may be made.

Hereinafter, a power supply according to an embodiment of the present disclosure and a gate driver included in the power supply will be described in detail with reference to the accompanying drawings.

Figure 1:
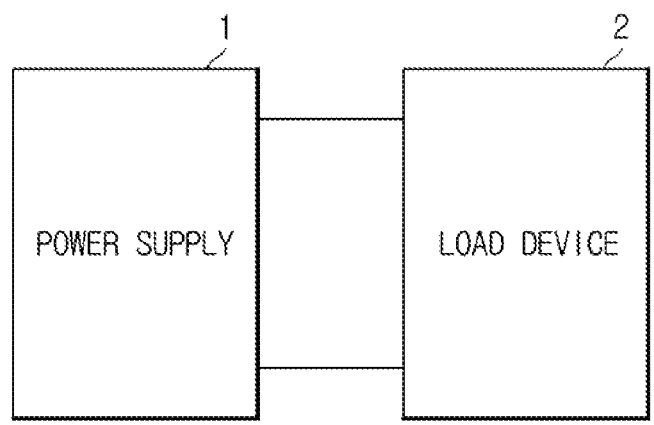
FIG. 1 illustrates a power supply according to an embodiment of the present disclosure and a load device.
Figure 2:
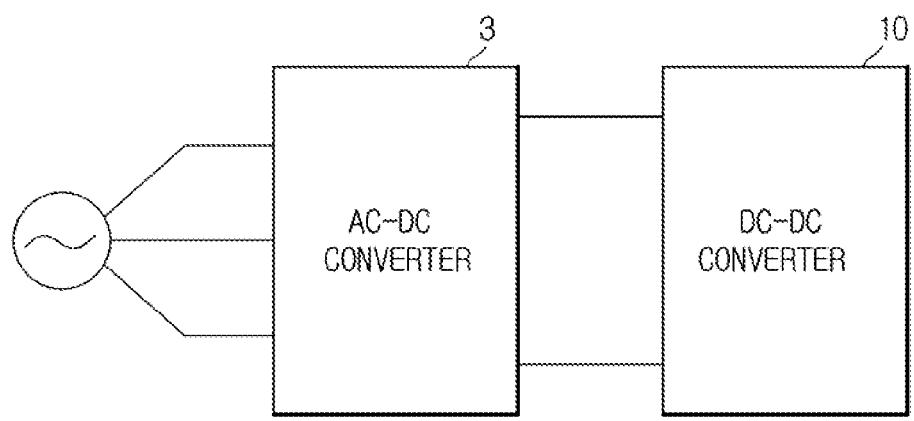
FIG. 2 illustrates a configuration of the power supply according to an embodiment of the present disclosure.

FIG. 1 illustrates a power supply according to an embodiment of the present disclosure and a load device. FIG. 2 illustrates a configuration of the power supply according to an embodiment of the present disclosure.

As illustrated in FIG. 1, an electric appliance generally includes a power supply 1 to supply power, and a load device 2 to perform an intrinsic operation thereof by power received from the power supply 1.

The load device 2 may be a motor, an inverter to drive a motor, a display panel, a speaker, a microphone, a touchpad, a semiconductor device, or the like, which performs an intrinsic operation thereof by power supplied thereto.

When the electric appliance utilizes AC power, the power supply 1 may include an AC-DC converter 3 to convert AC power into DC power, and a DC-DC converter 10 to convert a voltage of the converted DC power, as illustrated in FIG. 2. Of course, when the electric appliance utilizes DC power, the power supply 1 may dispense with the AC-DC converter 3.

The AC-DC converter 3 may include a rectifying circuit (not shown) to rectify AC voltage and AC current, and a smoothing circuit (not shown) to remove a ripple component from the rectified power. The rectifying circuit includes a diode bridge to force current to flow in one direction. The smoothing circuit includes a capacitor to store electrical energy and to output a constant voltage.

The DC-DC converter 10 includes a power switching element Q10. The DC-DC converter 10 converts a DC voltage input thereto in accordance with the ratio of the ON duration of the power switching element Q10 to the total switching time (hereinafter, referred to as a "duty ratio"), and outputs the converted DC voltage.

Typical types of such a DC-DC converter include a buck converter, a boost converter, a buck-boost converter, a forward converter, and a flyback converter, for example.

Figure 3:
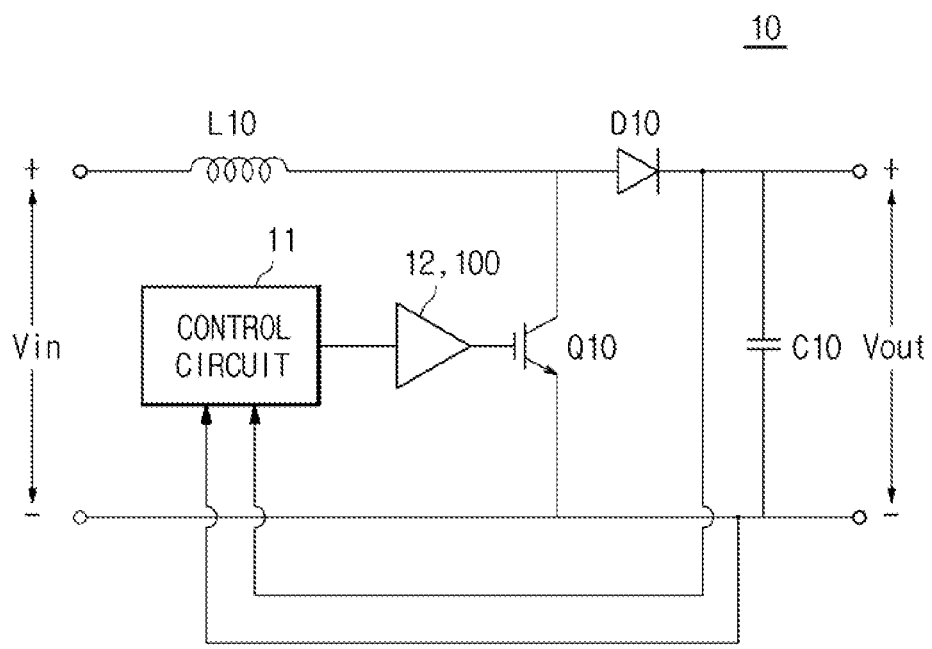
FIG. 3 illustrates an example of the DC-DC converter included in the power supply according to an embodiment of the present disclosure.

FIG. 3 illustrates an example of the DC-DC converter included in the power supply according to an embodiment of the present disclosure. In detail, FIG. 3 illustrates a boost converter.

Referring to FIG. 3, the DC-DC converter 10 includes a power switching element Q10 to control current, a power inductive element L10 to store magnetic energy generated by current, a power capacitive element C10 to store electrical energy generated by current, a power rectifying element D10 to limit a flow direction of current, a control circuit 11 to turn on or off the power switching element Q10, and a gate drive circuit 12 or 100 to drive the power switching element Q10.

The DC-DC converter 10 stores energy in the power inductive element L10 or power capacitive element C10 in accordance with an ON or OFF state of the power switching element Q10, and supplies voltage-converted DC power to the load device 2.

Operation of the boost converter illustrated in FIG. 3 as an example of the DC-DC converter 10 will be described in brief.

The control circuit 11 detects a magnitude of a voltage supplied to the load device 2 (FIG. 1), and outputs a control signal for turning-on/off of the power switching element Q10 in accordance with the detected voltage magnitude. The gate drive circuit 12 or 100 turns on or off the power switching element Q10 in accordance with the control signal from the control circuit 11.

When the power switching element Q10 is in an ON state, current input from the AC-DC converter 3 (FIG. 2) or an external DC power source passes through the power inductive element L10 and power switching element Q10. Accordingly, the power inductive element L10 stores magnetic energy generated through flow of current. The power capacitive element C10 supplies DC power to the load device 2 (FIG. 1), using electrical energy stored in the power capacitive element C10. The power rectifying element D10 prevents current output from the power capacitive element C10 from flowing to the power switching element Q10.

When the power switching element Q10 is in an OFF state, current generated by the magnetic energy stored in the power inductive element L10 is supplied to the power capacitive element C10 and load device 2 (FIG. 1). In this case, the power capacitive element C10 stores electrical energy generated by current input thereto from the power inductive element L10.

When ON/OFF operations of the power switching element Q10 are rapidly carried out, an output voltage is determined in accordance with the ratio of the ON duration of the power switching element Q10 to the total switching time, namely, the duty ratio of the power switching element Q10.

Although FIG. 3 illustrates the boost converter as the DC-DC converter 10, the boost converter is only an example of the DC-DC converter 10. Any DC-DC converter may be employed, so long as the DC-DC converter includes the power switching element Q10. As described above, a buck converter, a boost converter, a buck-boost converter, a forward converter, or a flyback converter, for example, may be employed as the DC-DC converter.

When the external AC power is 220V/110V AC power for home use, the voltage of the DC power output from the AC-DC converter 3 (FIG. 2) may be 310V/155V.

That is, the input voltage of the DC-DC converter 10, namely, an input voltage Vin, is 310V/155V. As a result, the power switching element Q10 should withstand a high voltage of 310V/155V in an OFF state thereof. In an ON state of the power switching element Q10, large current of several or several tens of amperes (A) should flow through the power switching element Q10 in order to store a large quantity of magnetic energy in the power inductive element L10.

As the power switching element Q10, which is a high-voltage large-current switching element, as described above, there is typically an insulated gate bipolar transistor (IGBT), a field effect transistor (FET), or the like.

When an IGBT or an FET is employed, a gate capacitor is present at the gate of the power switching element Q10. The power switching element Q10 is turned on when the gate capacitor is in a charge state. The power switching element Q10 is turned off when the gate capacitor is in a discharge state.

In order to short-circuit or open a high voltage of 310V/155V, a voltage of 10 to 20V is generally input to the gate of the power switching element Q10 (a gate terminal in the case of an IGBT or an FET). That is, a difference of 10 to 20V is required between the input voltage in the ON state of the power switching element Q10 and the input voltage in the OFF state of the power switching element Q10, in order to distinguish the ON and OFF states of the power switching element Q10 from each other.

On the other hand, a general logic circuit, for example, a transistor-transistor logic (TTL) circuit or a complementary metal oxide semiconductor (CMOS) circuit, uses a voltage of 5 to 3.3V or less. The control circuit 11 illustrated in FIG. 3 is an example of such a logic circuit, and uses a voltage of 5 to 3.3V.

As described above, a voltage of 10 to 20V is required to turn on or off the power switching element Q10 employed in the DC-DC converter 10, whereas the control circuit 11 to generate a control signal for turning-on/off of the power switching element Q10 outputs a signal of 3.3 to 5V. To this end, the gate drive circuit 12 or 100 is provided to intervene between the control circuit 11 and the power switching element Q10.

In other words, the gate drive circuit 12 or 100 receives the control signal output from the control circuit 11, and turns on or off the power switching element Q10 in accordance with the received control signal. For example, the gate drive circuit 12 or 100 may receive a control signal of 5V from the control circuit 11, and may output a drive signal of 15V to the power switching element Q10.

Figure 4:
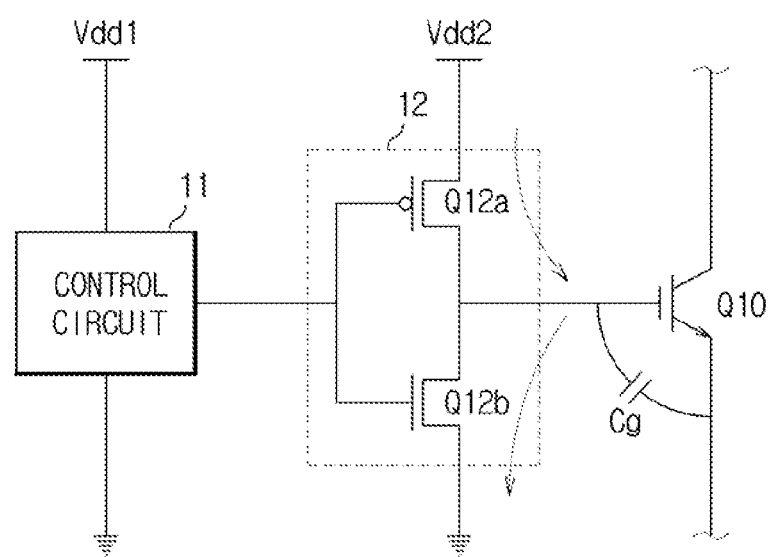
FIG. 4 illustrates a conventional gate drive circuit.

FIG. 4 illustrates a conventional gate drive circuit.

Referring to FIG. 4, the conventional gate drive circuit, which is designated by reference numeral "12", employs the control circuit 11, and a separate supply voltage source Vdd2. For example, when the control circuit 11 uses a supply voltage source Vdd1, the conventional drive circuit 12 uses a supply voltage source Vdd2 of 15V.

In addition, the conventional gate drive circuit 12 includes a first switch Q12a connected to the 15V supply voltage source Vdd2, and a second switch Q12b connected to ground. A node between the first switch Q12a and the second switch Q12b is connected to the power switching element Q10.

The conventional drive circuit 12 operates as follows. When the power switching element Q10 turns on, the first switch Q12a is turned on and, as such, the gate capacitor Cg of the power switching element Q10 is charged by the 15V supply voltage source Vdd2. On the other hand, when the power switching element Q10 turns off, the second switch Q12b is turned on and, as such, the gate capacitor Cg is discharged.

In the conventional gate drive circuit 12, electrical energy charged in the gate capacitor Cg in the ON state of the power switching element Q10 is discharged to ground in the OFF state of the power switching element Q10.

In other words, energy loss caused by switching operation of the power switching element Q10 is generated. Such energy loss is called "switching loss". Such switching loss depends on the voltage to drive the power switching element Q10, the capacitance of the gate capacitor Cg of the power switching element Q10, and the switching frequency of the power switching element Q10.

Hereinafter, a configuration of the gate drive circuit according to an embodiment of the present disclosure will be described.

Figure 5:
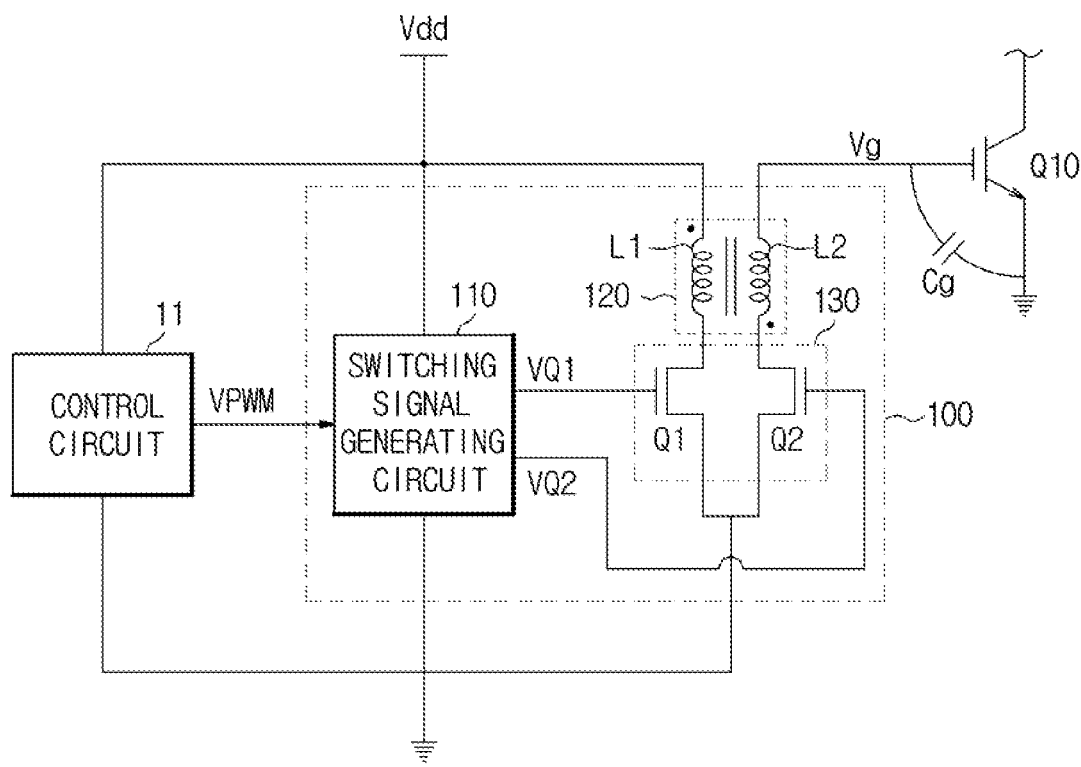
FIG. 5 illustrates a gate drive circuit according to an embodiment of the present disclosure.
Figure 6:
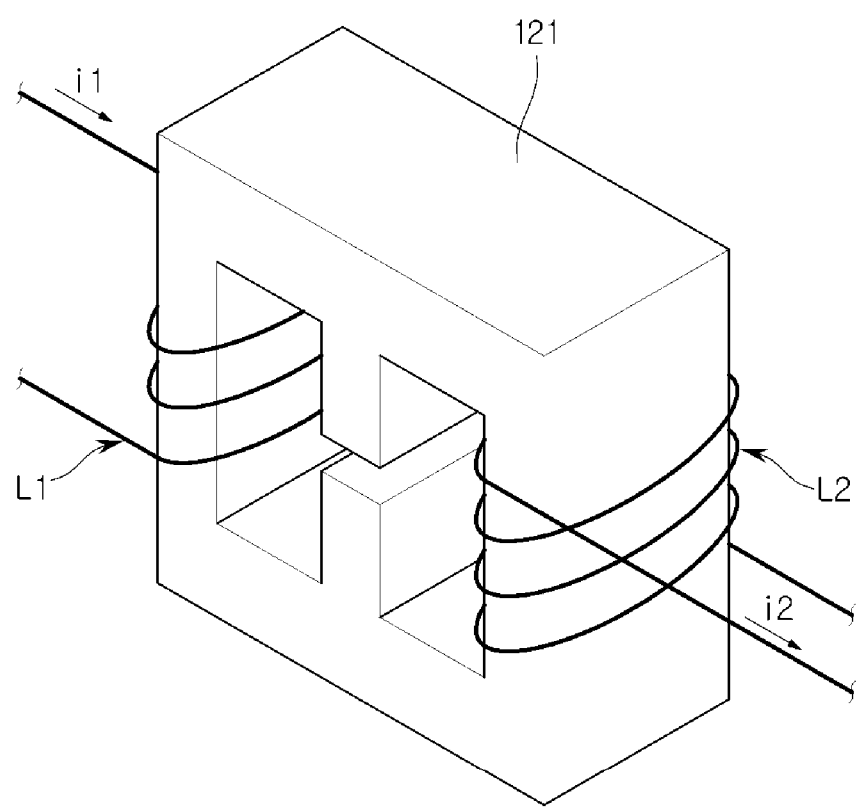
FIG. 6 illustrates an example of a transformer included in the gate drive circuit according to the embodiment of FIG. 5.

FIG. 5 illustrates a gate drive circuit according to an embodiment of the present disclosure. FIG. 6 illustrates an example of a transformer included in the gate drive circuit according to the embodiment of FIG. 5.

Referring to FIGS. 5 and 6, the gate drive circuit according to the illustrated embodiment, which is designated by reference numeral "100", includes a transformer 120, a switching circuit 130, and a switching signal generating circuit 110.

In particular, as illustrated in FIG. 5, the gate drive circuit 100 according to the illustrated embodiment may use the same supply voltage source Vdd as the control circuit 11. For example, when the control circuit 11 uses a 5V supply voltage source, the gate drive circuit 100 may also use a 5V supply voltage source.

The transformer 120 includes a first inductive circuit L1 connected to the supply voltage source Vdd, and a second inductive circuit L2 connected to the gate of the power switching element Q10 (a gate terminal in the case of an IGBT or an FET).

A magnetic core 121 is provided between the first inductive circuit L1 and the second inductive circuit L2, for transfer of magnetic energy between the first inductive circuit L1 and the second inductive circuit L2. Mutual inductance is generated between the first inductive circuit L1 and the second inductive circuit L2 by virtue of the magnetic core 121. That is, the first inductive circuit L1 and second inductive circuit L2 may transfer magnetic energy therebetween by the magnetic core 121.

For example, when first current i1 flows through the first inductive circuit L1, magnetic energy may be stored in the magnetic core 121 by the first current i1 flowing through the first inductive circuit L1. By the magnetic energy stored in the magnetic core 121, second current i2 may be generated at the second inductive circuit L2. On the other hand, when the second current i2 flows through the second inductive circuit L2, magnetic energy may be stored in the magnetic core 121 by the second current i2 flowing through the second inductive circuit L2. By the magnetic energy stored in the magnetic core 121, the first current i1 may be generated at the first inductive circuit L1.

The number of turns of the first inductive circuit L1 (the number of windings) and the number of turns of the second inductive circuit L2 depend on the ratio between an input voltage and an output voltage. In other words, the ratio between the number of turns of the first inductive circuit L1 (the number of windings) and the number of turns of the second inductive circuit L2 is determined by the ratio between the voltage of the supply voltage source Vdd and the gate voltage of the power switching element Q10, namely, a gate voltage Vg.

FIG. 6 illustrates a rectangular magnetic core having a void. Of course, the illustrated magnetic core is only an example of the magnetic core 121 and, as such, magnetic cores of other types may be employed.

The switching circuit 130 includes a first switching circuit Q1 and a second switching circuit Q2, which are arranged in parallel. The first switching circuit Q1 has one end connected to the first inductive circuit L1 of the transformer 120, and the other end connected to ground. The second switching circuit Q2 has one end connected to the second inductive circuit L2, and the other end connected to ground.

The first inductive circuit L1 and first switching circuit Q1 are connected in series between the supply voltage source Vdd and ground. The second inductive circuit L2 and second switching circuit Q2 are connected in series between the gate of the power switching circuit Q10 and ground.

Although FIG. 5 illustrates the gate drive circuit 100 as having an arrangement of the supply voltage source Vdd, the first and second inductive circuits L1 and L2, the first and second switching circuits Q1 and Q2, and ground arranged in this order, embodiments of the present disclosure are not limited to such an arrangement. For example, the gate drive circuit 100 may have an arrangement of the supply voltage source Vdd, the first and second switching circuits Q1 and Q2, the first and second inductive circuits L1 and L2, and ground arranged in this order.

The switching signal generating circuit 110 receives a control signal Vpwm from the control circuit 11, and outputs a first switching signal Vq1 and a second switching signal Vq2 to turn on/off the first switching circuit Q1 and second switching circuit Q2 included in the switching circuit 130, respectively.

Here, the control signal Vpwm is a signal to turn on/off the power switching element Q10 in order to control the output voltage of the DC-DC converter 10 (FIG. 3). The first and second switching signals Vq1 and Vq2 are signals to turn on/off the first and second switching circuits Q1 and Q2, respectively, in order to charge or discharge the gate capacitor Cg of the power switching element Q10.

Hereinafter, the control signal Vpwm, first switching signal Vq1 and second switching signal Vq2 will be described in detail.

Figure 7:
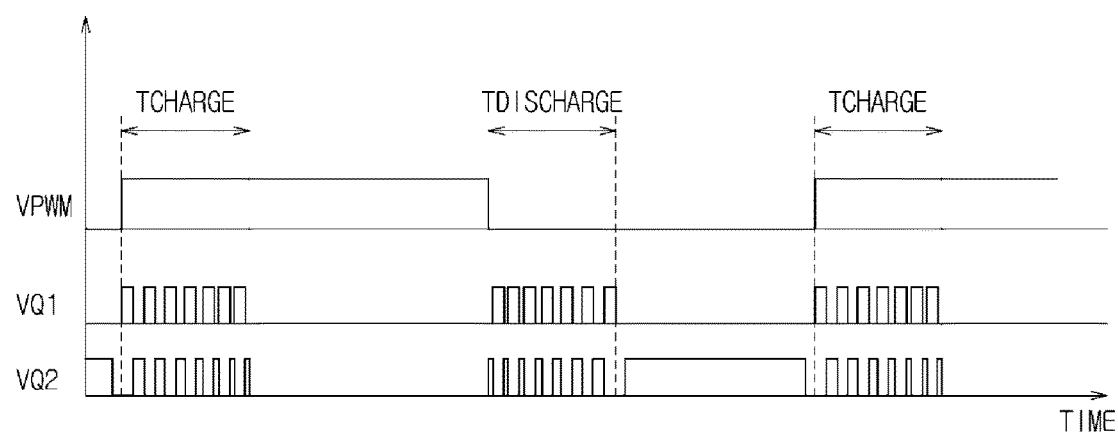
FIG. 7 illustrates a control signal, a first switching signal, and a second switching signal of the gate drive circuit according to an embodiment of the present disclosure.

FIG. 7 illustrates a control signal, a first switching signal, and a second switching signal of the gate drive circuit according to an embodiment of the present disclosure.

Referring to FIG. 7, the switching signal generating circuit 110 outputs the first switching signal Vq1 to turn on/off the first switching circuit Q1 and the second switching signal Vq2 to turn on/off the second switching circuit Q2 when the control signal Vpwm output from the control circuit 11 is changed from an "OFF (LOW)" level to an "ON (HIGH)" level or from the "HIGH" level to the "LOW" level.

When the control signal Vpwm is changed from "LOW" to "HIGH", the first switching signal Vq1 and second switching signal Vq2 repeatedly have "HIGH" and "LOW" levels for a charge time Tcharge.

In particular, when the first switching signal Vq1 is first changed to "HIGH", the second switching signal Vq2 is subsequently changed to "HIGH" in response to level change of the first switching signal Vq1. That is, the second switching signal Vq2 is changed to "HIGH" when the first switching signal Vq1 is changed to "LOW". Accordingly, the first switching signal Vq1 and second switching signal Vq2 are not simultaneously turned on. That is, when the first switching circuit Q1 is turned off after being turned on, the second switching circuit Q2 is turned on.

For the charge time Tcharge, the ratio of the "HIGH"-level duration of the first switching signal Vq1 to the switching time, namely, the duty ratio of the first switching signal Vq1, is increased. In order to increase the duty ratio of the first switching signal Vq1, the switching signal generating circuit 110 may reduce the "LOW"-level duration of the first switching signal Vq1 (the OFF duration of the first switching circuit) while maintaining the "HIGH"-level duration of the first switching signal Vq1 (the ON duration of the first switching circuit).

Of course, the switching signal generating circuit 110 is not limited to the above-described condition. The switching signal generating circuit 110 may reduce the "LOW"-level duration of the first switching signal Vq1 (the OFF duration of the first switching circuit) while increasing the "HIGH"-level duration of the first switching signal Vq1 (the ON duration of the first switching circuit).

In accordance with an embodiment of the present disclosure, the ratio of the output voltage of the gate drive circuit 100 (the gate voltage of the power switching element) to the input voltage (voltage from the supply voltage source) of the gate drive circuit 100 is determined in accordance with the turn number ratio between the first inductive circuit L1 and the second inductive circuit L2 and the duty ratio of the first switching signal Vq1.

In other words, when the turn number ratio between the first inductive circuit L1 and the second inductive circuit L2 is constant, it may be possible to raise the output voltage of the gate drive circuit 100 by increasing the duty ratio of the first switching signal Vq1. In particular, it may be possible to output a higher voltage than that of the supply voltage source Vdd to the gate of the power switching element Q10 through an increase in the duty ratio of the first switching signal Vq1.

During the charge time Tcharge, the second switching signal Vq2 has a level opposite to that of the first switching signal Vq1. In other words, when the first switching signal Vq1 is "HIGH", the second switching signal Vq2 is "LOW". When the first switching signal Vq1 is "LOW", the second switching signal Vq2 is "HIGH".

As a result, the first switching circuit Q1 and second switching circuit Q2 are alternately turned on and off. Of course, the first switching signal Vq1 and second switching signal Vq2 are not always opposite to each other. There may be a dead time in which both the first switching signal Vq1 and the second switching signal Vq2 are "LOW".

For the charge time Tcharge, the ratio of the "HIGH"-level duration of the second switching signal Vq2 to the switching time, namely, the duty ratio of the second switching signal Vq2, is decreased. In order to decrease the duty ratio of the second switching signal Vq2, the switching signal generating circuit 110 may reduce the "HIGH"-level duration of the second switching signal Vq2 (the ON duration of the second switching circuit) without varying the "LOW"-level duration of the second switching signal Vq2 (the OFF duration of the second switching circuit).

Of course, the switching signal generating circuit 110 is not limited to the above-described condition. The switching signal generating circuit 110 may reduce the "HIGH"-level duration of the second switching signal Vq2 (the ON duration of the second switching circuit) while increasing the "LOW"-level duration of the second switching signal Vq2 (the OFF duration of the second switching circuit).

For the time in which the second switching signal Vq2 is "HIGH", current is generated at the second inductive circuit L2 by magnetic energy stored in the magnetic core 121. As current flows through the second inductive circuit L2, electrical energy is supplied to the gate capacitor Cg of the power switching element Q10 and, as such, the gate voltage Vg of the power switching element Q10 rises.

When the control signal Vpwm is maintained at a "HIGH" level after the charge time Tcharge, both the first switching signal Vq1 and the second switching signal Vq2 are maintained at a "LOW" level. That is, both the first switching circuit Q1 and the second switching circuit Q2 are maintained at a "LOW" level.

When the control signal Vpwm output from the control circuit 11 is changed from "HIGH" to "LOW", the first switching signal Vq1 and second switching signal Vq2 repeatedly have "LOW" and "HIGH" levels for a discharge time Tdischarge.

In particular, in a discharge operation, conversely to the charge operation, the second switching signal Vq2 is first changed to "HIGH", and the first switching signal Vq1 is subsequently changed to "HIGH" in response to level change of the second switching signal Vq2. That is, the second switching circuit Q2 is first turned on, and the first switching circuit Q1 is subsequently turned on.

For the discharge time Tdischarge, the ratio of the "HIGH"-level duration of the second switching signal Vq2 to the switching time, namely, the duty ratio of the second switching signal Vq2, is increased.

In order to increase the duty ratio of the second switching signal Vq2, the switching signal generating circuit 110 may increase the "HIGH"-level duration of the second switching signal Vq2 (the ON duration of the second switching circuit) without varying the "LOW"-level duration of the second switching signal Vq2 (the OFF duration of the second switching circuit).

Of course, the switching signal generating circuit 110 is not limited to the above-described condition. The switching signal generating circuit 110 may reduce the "LOW"-level duration of the second switching signal Vq2 (the OFF duration of the second switching circuit) while increasing the "HIGH"-level duration of the second switching signal Vq2 (the ON duration of the second switching circuit).

During the discharge time Tdischarge, the first switching signal Vq1 has a level opposite to that of the second switching signal Vq2. As a result, the first switching circuit Q1 and second switching circuit Q2 are alternately turned on and off for the discharge time Tdischarge. Of course, the first switching signal Vq1 and second switching signal Vq2 are not always opposite to each other. There may be a dead time in which both the first switching signal Vq1 and the second switching signal Vq2 are "LOW".

For the discharge time Tdischarge, the ratio of the "HIGH"-level duration of the first switching signal Vq1 to the switching time, namely, the duty ratio of the first switching signal Vq1, is decreased.

In order to decrease the duty ratio of the first switching signal Vq1, the switching signal generating circuit 110 may increase the "LOW"-level duration of the first switching signal Vq1 (the OFF duration of the first switching circuit) without varying the "HIGH"-level duration of the first switching signal Vq1 (the ON duration of the first switching circuit).

Of course, the switching signal generating circuit 110 is not limited to the above-described condition. The switching signal generating circuit 110 may increase the "LOW"-level duration of the first switching signal Vq1 (the OFF duration of the first switching circuit) while reducing the "HIGH"-level duration of the first switching signal Vq1 (the ON duration of the first switching circuit).

When the control signal Vpwm is maintained at a "LOW" level after the discharge time Tdischarge, both the first switching signal Vq1 is maintained at a "LOW" level, and the second switching signal Vq2 is maintained at a "HIGH" level. That is, the second switching circuit Q2 is turned on and, as such, the gate of the power switching element Q10 is connected to ground.

Hereinafter, operation of the gate drive circuit 100 to turn on or off the power switching element Q10 will be described in detail.

Figure 8:
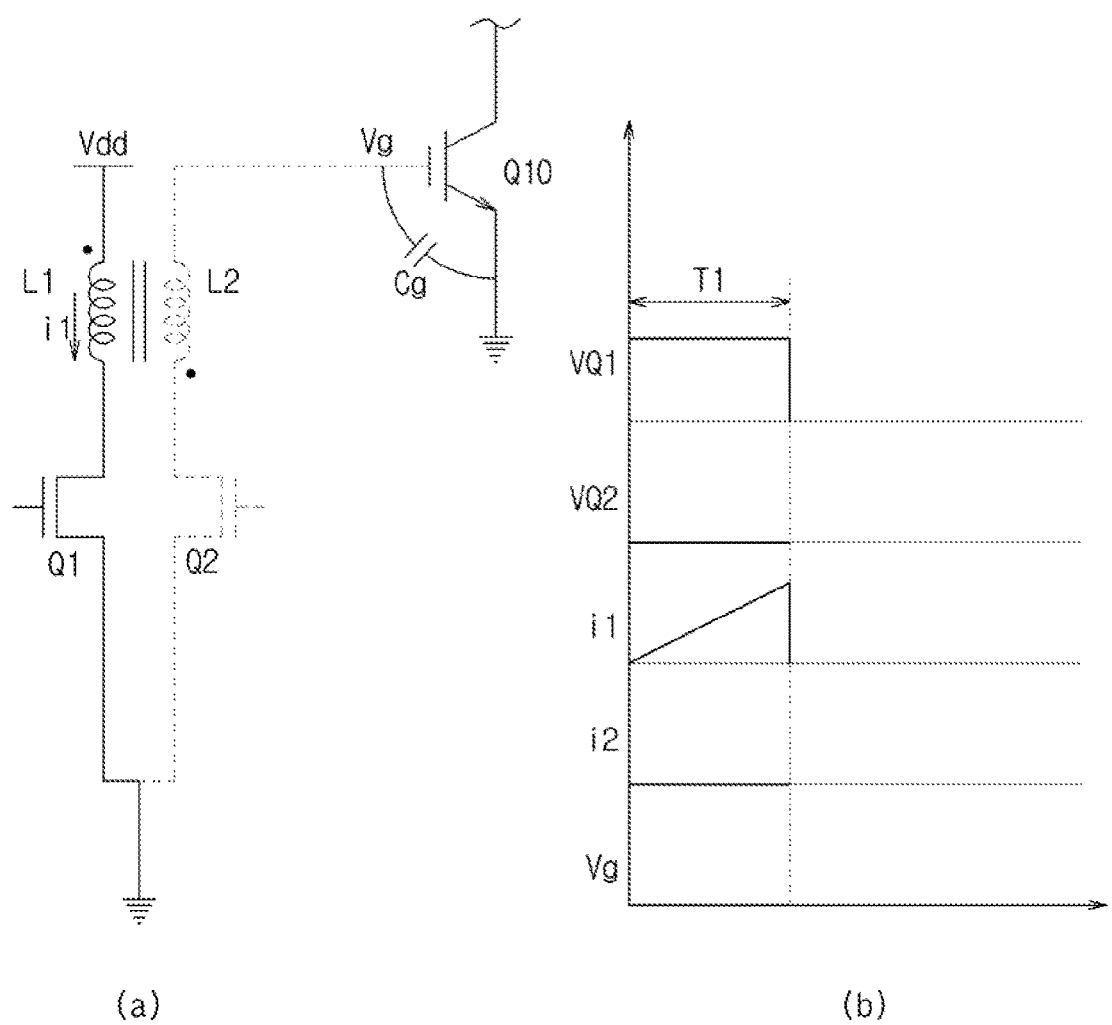
FIGS. 8, 9, and 10 illustrate an example in which the gate drive circuit turns on the power switching element in accordance with an embodiment of the present disclosure.
Figure 9:
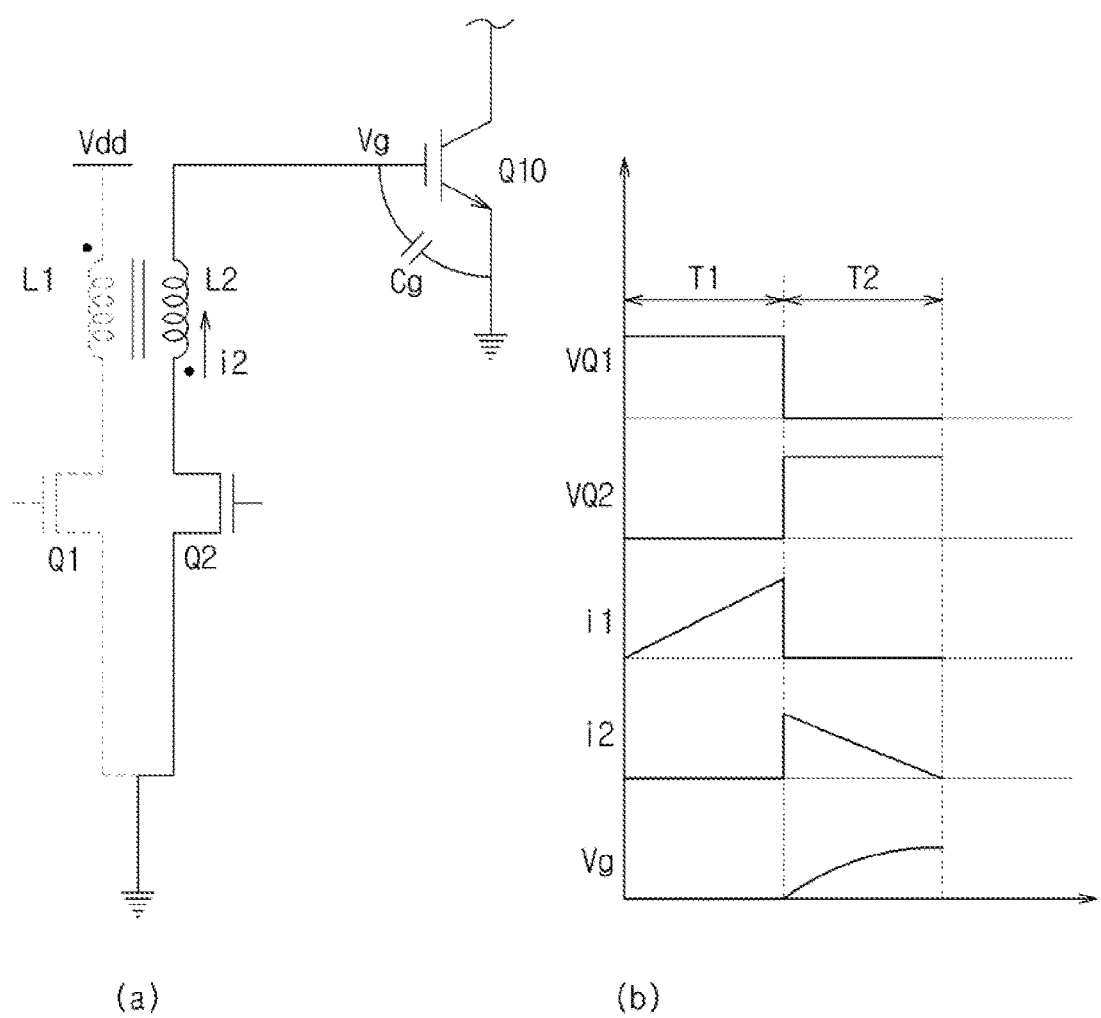
Figure 10:
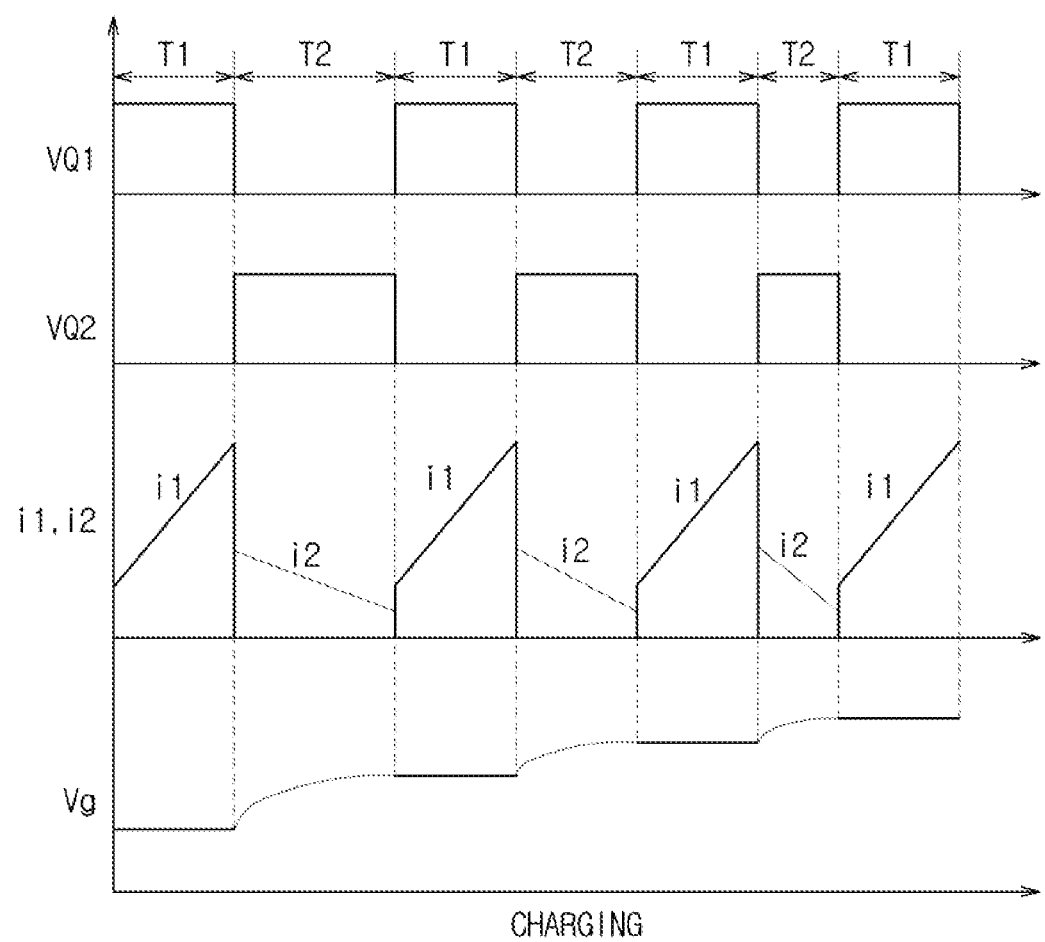
Figure 11:
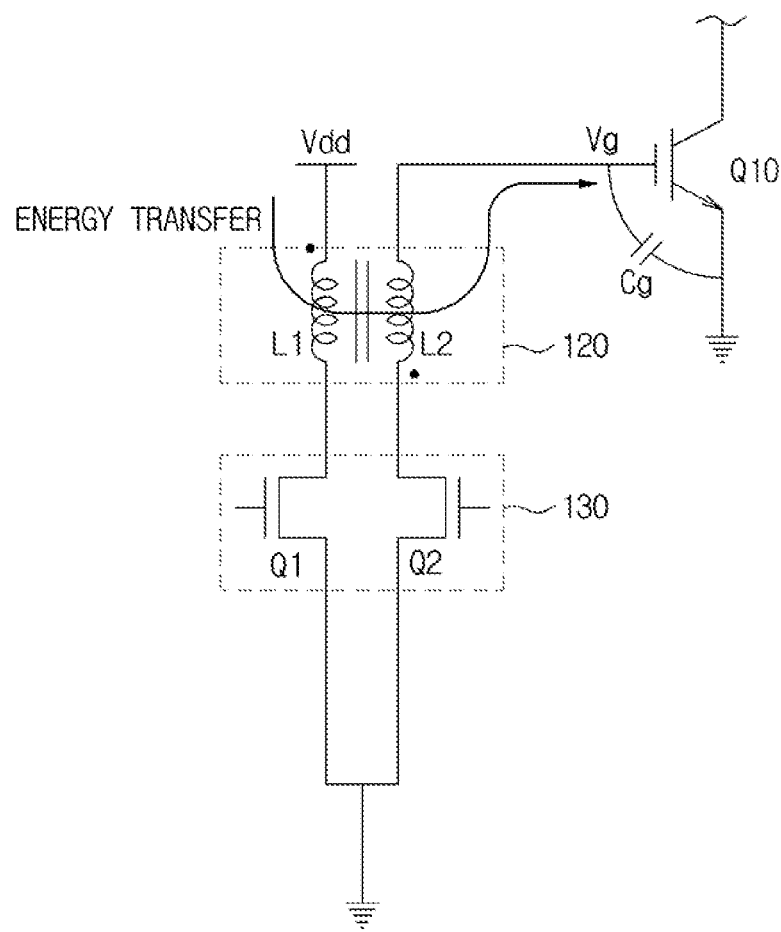
FIG. 11 illustrates operation of the gate drive circuit to transfer electrical energy from a supply voltage source to the power switching element in accordance with an embodiment of the present disclosure.

FIGS. 8 to 10 illustrate an example in which the gate drive circuit turns on the power switching element in accordance with an embodiment of the present disclosure. FIG. 11 illustrates operation of the gate drive circuit to transfer electrical energy from the supply voltage source to the power switching element in accordance with an embodiment of the present disclosure.

When the first switching signal Vq1 is changed to "HIGH", and the second switching signal Vq2 is changed to "LOW", as illustrated in FIG. 8(b), the first switching circuit Q1 is turned on, and the second switching circuit Q2 is turned off, as illustrated in FIG. 8(a).

When the first switching circuit Q1 is turned on, first current i1 to flow from the supply voltage source Vdd toward ground after passing through the first inductive circuit L1 is generated, as illustrated in FIG. 8(a). In this case, the first current i1 increases slowly without being abruptly increased, due to inductance of the first inductive circuit L1, as illustrated in FIG. 8(b).

By the slowly increasing first current i1, magnetic energy is stored in the first inductive circuit L1. The magnetic energy stored in the first inductive circuit L1 is also supplied to the second inductive circuit L2, due to mutual inductance between the first inductive circuit L1 and the second inductive circuit L2.

When a first ON duration T1, in which the first switching circuit Q1 is turned on, elapses, the first switching signal Vq1 is changed to "LOW", and the second switching signal Vq2 is changed to "HIGH", as illustrated in FIG. 9(b). As a result, the first switching circuit Q1 is turned off, and the second switching circuit Q2 is turned on, as illustrated in FIG. 9(a).

When the second switching circuit Q2 is turned on, second current i2 is generated at the second inductive circuit L2 by magnetic energy stored in the second inductive circuit L2. In this case, the second current i2 is reverse to the first current i1 in direction, due to different winding directions of the first inductive circuit L1 and second inductive circuit L2. That is, the second current i2 flows from ground toward the power switching element Q10.

During the time in which the second current i2 is supplied to the gate of the power switching element Q10, the gate capacitor Cg of the power switching element Q10 is charged. As the gate capacitor Cg is charged, the gate voltage Vg of the power switching element Q10 rises.

In accordance with an increase of the gate voltage Vg of the power switching element Q10, a voltage reverse to the second current i2 in direction is applied across the second inductive circuit L2. That is, the second current i2 flows from ground toward the gate of the power switching element Q10, whereas the potential of the second inductive circuit L2 is higher at the side of the power switching element Q10 than at the side of ground.

As a result, the second current i2 is gradually reduced, as illustrated in FIG. 9(b). The second switching circuit Q2 is turned off before the second current i2 becomes zero. That is, the time in which the second switching circuit Q2 is turned on, namely, a second ON duration T2, is continued until the second current i2 becomes zero.

Thereafter, the first switching circuit Q1 and second switching circuit Q2 are repeatedly turned on and off. In accordance with repeated turning on/off of the first and second switching circuits Q1 and Q2, the gate voltage Vg of the power switching element Q10 increases gradually, as illustrated in FIG. 10.

In addition, referring to FIG. 10, the second ON duration T2, namely, the time in which the second switching circuit Q2 is turned on, is reduced in accordance with an increase of the gate voltage Vg of the power switching element Q10.

As described above, a voltage interfering with the second current i2 is applied to the second inductive circuit L2 by the gate voltage Vg of the power switching element Q10 and, as such, the second current i2 is reduced. In addition, when the gate voltage Vg of the power switching element Q10 increases, the voltage reverse to the second current i2 in direction is increased and, as such, the second current i2 is more rapidly reduced. As a result, the switching signal generating circuit 110 reduces the ON duration of the second switching circuit Q2, namely, the second ON duration T2.

Accordingly, the duty ratio of the second switching signal Vq2 is decreased, and the duty ratio of the first switching signal Vq1 is increased.

In brief, as illustrated in FIG. 11, electrical energy from the supply voltage source Vdd is supplied to the gate of the power switching element Q10 via the transformer 120 in accordance with switching operation of the switching circuit 130, thereby turning on the power switching element Q10.

In other words, in the gate drive circuit 100 according to the illustrated embodiment of the present disclosure, the first current i1 is supplied from the supply voltage source Vdd to the first inductive circuit L1 in order to store magnetic energy in the first inductive circuit L1 and second inductive circuit L2, and the second current i2 is supplied to the gate of the power switching element Q10, using the magnetic energy stored in the second inductive circuit L2 and, as such, the gate voltage Vg of the power switching element Q10 is raised by the second current i2.

Through the above-described procedures, the gate drive circuit 100 may turn on the power switching element Q10, as illustrated in FIG. 11.

In addition, a higher voltage than the voltage supplied from the supply voltage source Vdd may be supplied to the gate of the power switching element Q10 in accordance with the turn number ratio between the first inductive circuit L1 and the second inductive circuit L2 and the duty ratio of the first switching signal Vq1.

Furthermore, the gate drive circuit 100 according to the illustrated embodiment of the present disclosure may adjust the ON duration of the power switching element Q10, namely, the charge time.

For example, the charge time may be adjusted through adjustment of the ON/OFF durations of the first and second switching circuits Q1 and Q2.

In detail, energy supplied from the supply voltage source Vdd to the first inductive circuit L1 depends on the ON duration of the first switching circuit Q1. That is, when the ON duration of the first switching circuit Q1 increases, the amount of current supplied to the first inductive circuit Q1 is increased and, as such, the quantity of magnetic energy stored in the magnetic core 121 is also increased. As a result, the amount of current supplied to the gate capacitor Cg of the power switching element Q10 in an ON state of the second switching circuit Q2 is also increased.

Meanwhile, energy supplied from the second inductive circuit L2 to the gate capacitor Cg of the power switching element Q10 depends on the ON duration of the second switching circuit Q2. That is, when the ON duration of the second switching circuit Q2 increases, the total amount of current supplied from the second inductive circuit Q2 to the gate capacitor Cg of the power switching element Q10 is increased. Of course, the ON duration of the second switching circuit Q2 is limited to the time until the direction of current flowing through the second inductive circuit Q2 is changed.

As described above, energy supplied from the supply voltage source Vdd to the gate capacitor Cg of the power switching element Q10 is varied in accordance with the ON durations of the first and second switching elements Q1 and Q2 and, as such, charge time may be adjusted through adjustment of the ON durations of the first and second switching elements Q1 and Q2.

In an example, charge time may be adjusted through adjustment of conductance of the first switching circuit Q1 and conductance of the second switching circuit Q2.

Referring to FIG. 10, charge time depends on current supplied from the supply voltage source Vdd to the first inductive circuit L1 during an ON state of the first switching circuit Q1 and current supplied from the second inductive circuit L2 to the gate capacitor Cg of the second inductive circuit L2 during an ON state of the second switching circuit Q2.

In this case, when conductance of the first switching circuit Q1 and conductance of the second switching circuit Q2 increase, current supplied to the first inductive circuit L1 during the first ON duration T1 is increased, and current supplied from the second inductive circuit L2 to the gate capacitor Cg during the second ON duration T2 is increased. In other words, when conductance of the first switching circuit Q1 and conductance of the second switching circuit Q2 increase, the rate of increase of the voltage of the gate capacitor Cg is increased. That is, charge time is reduced.

Conversely, conductance of the first switching circuit Q1 and conductance of the second switching circuit Q2 decrease, charge time is increased.

The switching signal generating circuit 110 may have a dead time in which both the first switching circuit Q1 and the second switching circuit Q2 are turned off, by maintaining both the first switching signal Vq1 and the second switching signal Vq2 at a "LOW" level for a predetermined time after the first ON duration T1 in which the first switching circuit Q1 is turned on and the second ON duration T2 in which the second switching circuit Q2 is turned on.

The gate drive circuit 100 does not transfer energy from the supply voltage source Vdd to the gate capacitor Cg during the dead time and, as such, charge time is increased when the dead time increases.

Figure 12:
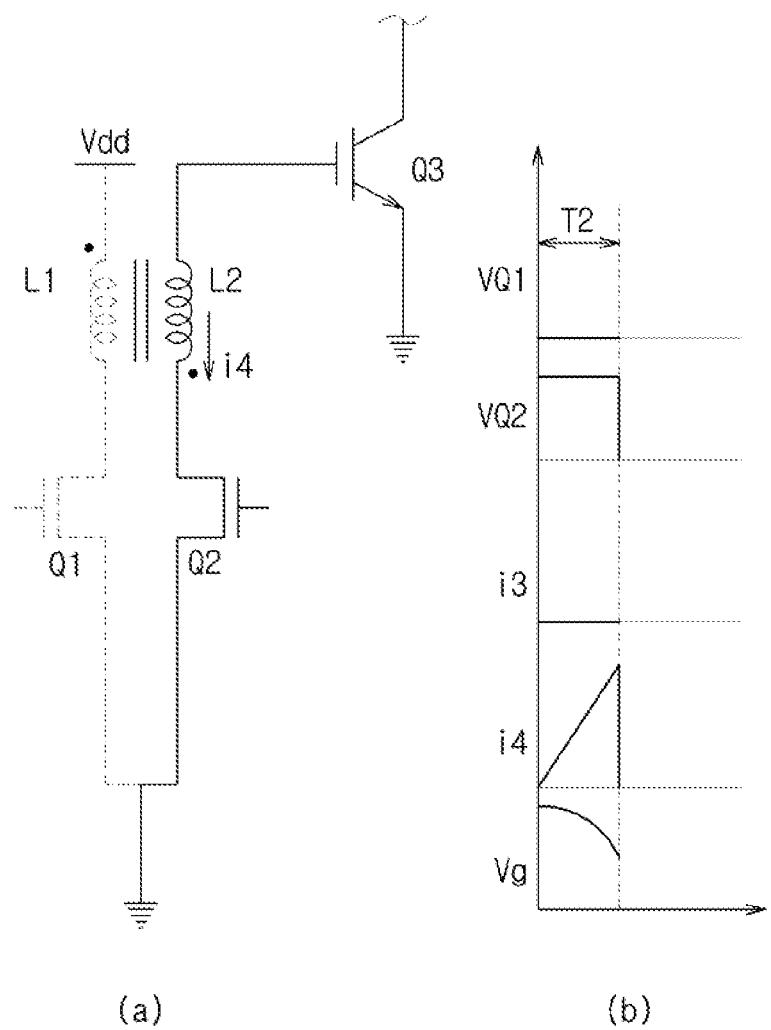
FIGS. 12, 13, and 14 illustrate an example in which the gate drive circuit turns off the power switching element in accordance with an embodiment of the present disclosure.
Figure 13:
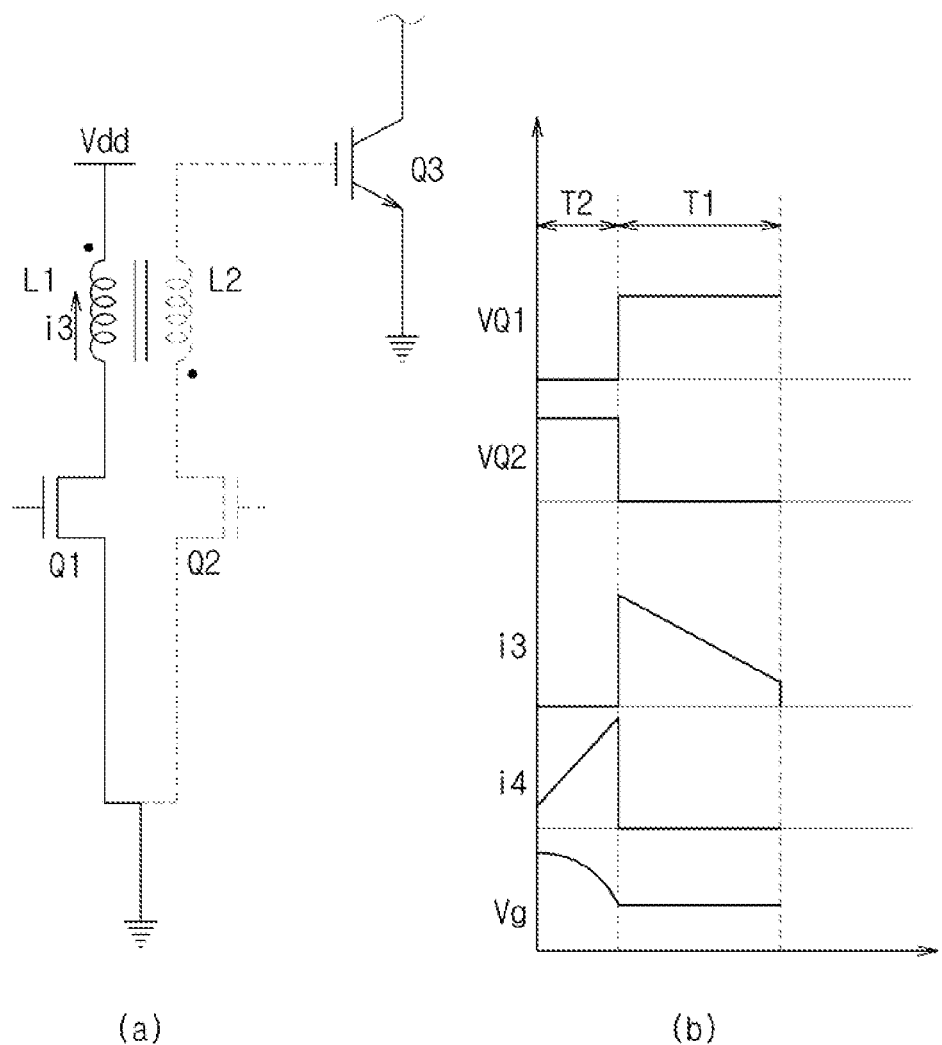
Figure 14:
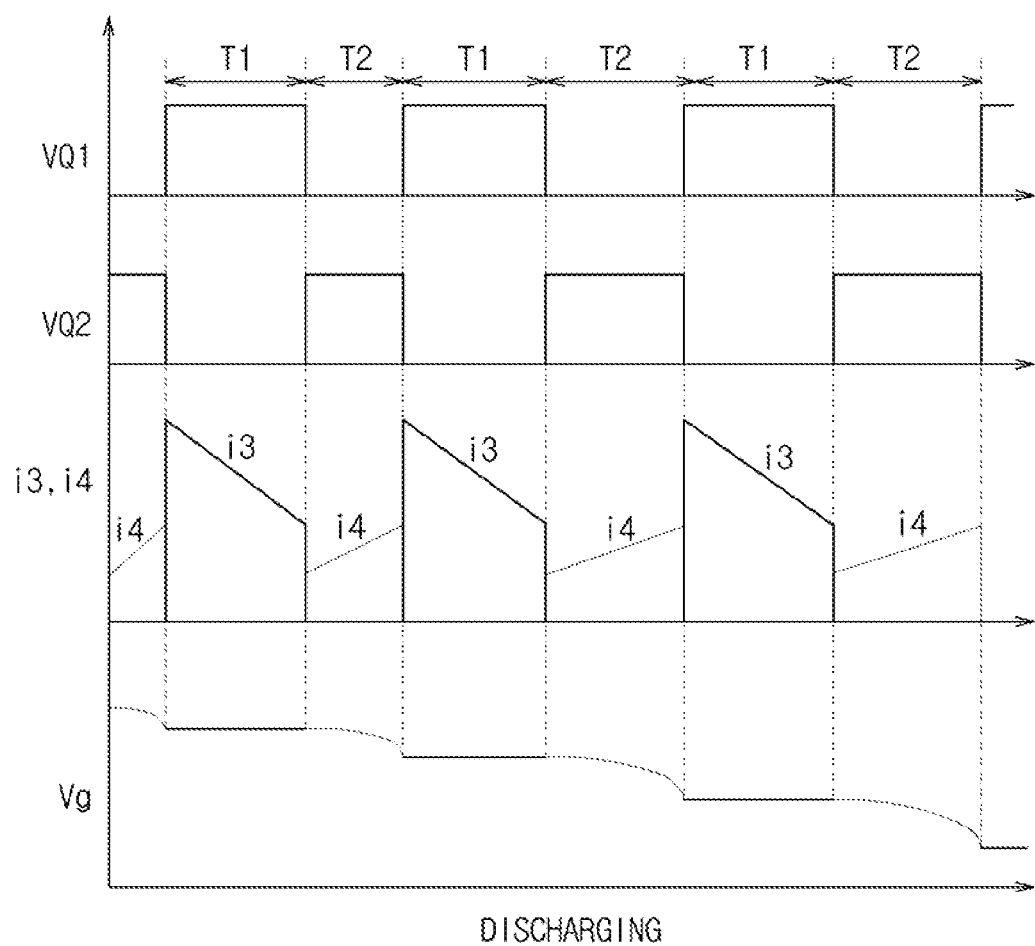
Figure 15:
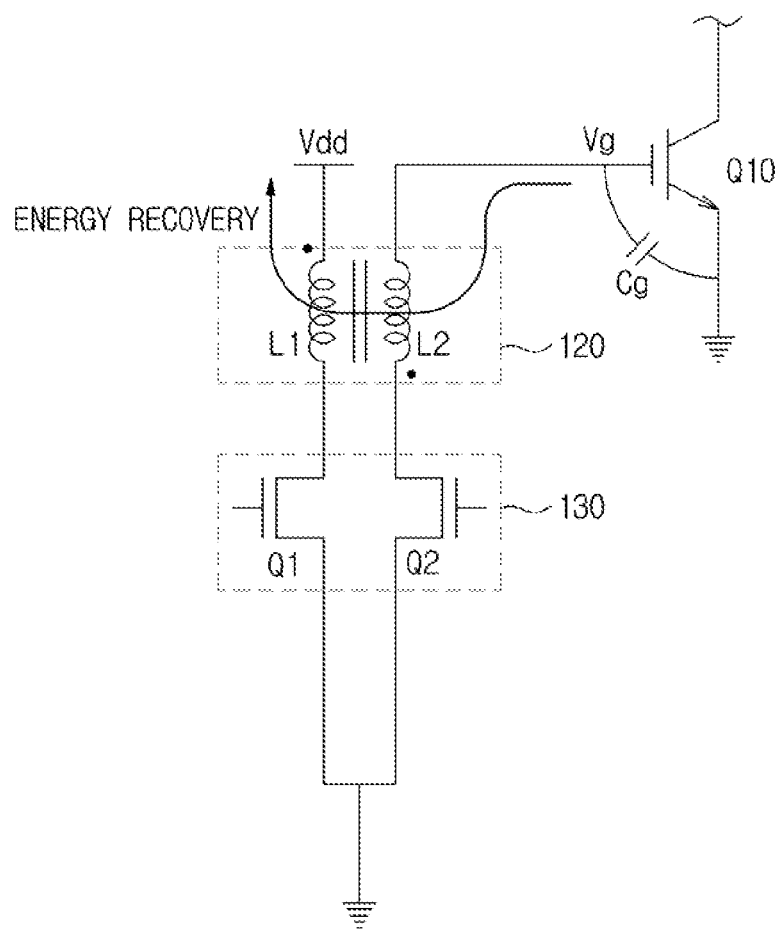
FIG. 15 illustrates operation of the gate drive circuit to recover electrical energy from the power switching element to the supply voltage source in accordance with an embodiment of the present disclosure.

FIGS. 12 to 14 illustrate an example in which the gate drive circuit turns off the power switching element in accordance with an embodiment of the present disclosure. FIG. 15 illustrates operation of the gate drive circuit to recover electrical energy from the power switching element to the supply voltage source in accordance with an embodiment of the present disclosure.

When the second switching signal Vq2 is changed to "HIGH", and the first switching signal Vq1 is changed to "LOW", as illustrated in FIG. 12(b), the second switching circuit Q2 is turned on, and the first switching circuit Q1 is turned off, as illustrated in FIG. 12(a).

When the second switching circuit Q2 is turned on, fourth current i4 to flow from the power switching element Q10 toward ground after passing through the second inductive circuit L2 is generated, as illustrated in FIG. 12(a). The fourth current i4 generated in an OFF state of the power switching element Q10 is reverse in direction to the second current i2 generated in an ON state of the power switching element Q10.

The fourth current i4 increases slowly without being abruptly increased, due to inductance of the second inductive circuit L2, as illustrated in FIG. 12(b).

By the slowly increasing fourth current i2, magnetic energy is stored in the second inductive circuit L2. The magnetic energy stored in the second inductive circuit L2 is also supplied to the first inductive circuit L1, due to mutual inductance between the second inductive circuit L2 and the first inductive circuit L1.

Since the fourth current i4 is supplied from the gate of the power switching element C10, the gate capacitor Cg of the power switching element Q10 is discharged. As the gate capacitor Cg is discharged, the gate voltage Vg of the power switching element Q10 falls.

When the second ON duration T2, in which the second switching circuit Q2 is turned on, elapses, the second switching signal Vq2 is changed to "LOW", and the first switching signal Vq1 is changed to "HIGH", as illustrated in FIG. 13(b). As a result, the second switching circuit Q2 is turned off, and the first switching circuit Q1 is turned on, as illustrated in FIG. 13(a).

When the first switching circuit Q1 is turned on, third current i3 is generated at the first inductive circuit L1 by magnetic energy stored in the first inductive circuit L1. In this case, the third current i3 is reverse to the fourth current i1 in direction, due to different winding directions of the first inductive circuit L1 and second inductive circuit L2. The third current i3 generated in an OFF state of the power switching element Q10 is reverse in direction to the first current i1 generated in an ON state of the power switching element Q10. That is, the third current i3 flows from ground toward the supply voltage source Vdd.

By the supply voltage source Vdd, a voltage interfering with the third current i3 is applied across the first inductive circuit L1. As a result, the third current i3 is reduced, as illustrated in FIG. 13(b). In this case, the first switching circuit Q1 is turned off before the third current i3 becomes zero. That is, the first ON duration T1 in which the first switching circuit Q1 is turned on, is continued until the third current i3 becomes zero.

Thereafter, the first switching circuit Q1 and second switching circuit Q2 are repeatedly turned on and off. In accordance with repeated turning on/off of the first and second switching circuits Q1 and Q2, the gate voltage Vg of the power switching element Q10 falls gradually, as illustrated in FIG. 14.

In addition, referring to FIG. 14, the second ON duration T2, namely, the time in which the second switching circuit Q2 is turned on, is increased in accordance with decrease of the gate voltage Vg of the power switching element Q10.

As described above, supply of magnetic energy to the first inductive circuit L1 and second inductive circuit L2 is achieved by the fourth current i4, and the fourth current i4 is generated by the gate voltage Vg of the power switching element Q10. In this case, when the gate voltage Vg of the power switching element Q10 falls, the increase rate of the fourth current i4 flowing through the second inductive circuit L2 is decreased.

As a result, the rate of transferring energy from the gate of the power switching element Q10 to the magnetic core 121 (FIG. 6) is decreased. To this end, the second ON duration T2 is increased to enable constant energy to be transferred to the magnetic core 121 (FIG. 6).

For this reason, the duty ratio of the second switching signal Vq2 is increased, and the duty ratio of the first switching signal Vq1 is decreased.

In brief, electrical energy stored in the power switching element Q10 is recovered to the supply voltage source Vdd via the transformer 120 in accordance with switching operation of the switching circuit 130, as illustrated in FIG. 14.

In detail, the fourth current i4 is supplied from the gate capacitor Cg of the power switching element Q10 to the second inductive circuit L2 in order to store magnetic energy in the second inductive circuit L2 and first inductive circuit L1, and the third current i3 is supplied to the supply voltage source Vdd, using the magnetic energy stored in the first inductive circuit L1 and, as such, electrical energy stored in the gate of the power switching element Q10 is again recovered to the supply voltage source Vdd.

Through the above-described procedures, the gate drive circuit 100 turns off the power switching element Q10, and again recovers electrical energy stored in the power switching element Q10 to the supply voltage source Vdd, simultaneously with turning-off of the power switching element Q10.

In accordance with an embodiment of the present disclosure, the gate driver circuit 100 may adjust the OFF duration of the power switching element Q10, namely, discharge time.

For example, it may be possible to adjust discharge time by adjusting the ON/OFF durations of the first and second switching circuits Q1 and Q2.

In detail, energy supplied from the gate capacitor Cg of the power switching element Q10 to the second inductive circuit L2 depends on the ON duration of the second switching circuit Q2, whereas energy supplied from the first inductive circuit L1 to the supply voltage source Vdd depends on the ON duration of the first switching circuit Q1.

As described above, energy supplied from the gate capacitor Cg of the power switching element Q10 to the supply voltage source Vdd is varied in accordance with the ON durations of the first and second switching elements Q1 and Q2 and, as such, discharge time may be adjusted through adjustment of the ON durations of the first and second switching elements Q1 and Q2.

In an example, conductance of the first switching circuit Q1 and conductance of the second switching circuit Q2 may be adjusted, for adjustment of discharge time.

Referring to FIG. 14, discharge time depends on current supplied from the gate capacitor Cg of the second inductive circuit L2 to the second inductive circuit L2 during an ON state of the second switching circuit Q2, and current supplied from the first inductive circuit L1 to the supply voltage source Vdd during an ON state of the first switching circuit Q1.

In this case, when conductance of the first switching circuit Q1 and conductance of the second switching circuit Q2 increase, current supplied from the gate capacitor Cg to the second inductive circuit L2 during the second ON duration T2 is increased, and current supplied from the first inductive circuit L1 to the supply voltage source Vdd during the first ON duration T1 is increased. In other words, when conductance of the first switching circuit Q1 and conductance of the second switching circuit Q2 increase, the falling rate, or rate of decrease, of the voltage of the gate capacitor Cg is increased. That is, discharge time is reduced.

Conversely, conductance of the first switching circuit Q1 and conductance of the second switching circuit Q2 decrease, discharge time is increased.

The switching signal generating circuit 110 may have a dead time in which both the first switching circuit Q1 and the second switching circuit Q2 are turned off, by maintaining both the first switching signal Vq1 and the second switching signal Vq2 at a "LOW" level for a predetermined time after the second switching circuit Q2 and first switching circuit Q1 are alternately turned on.

The gate drive circuit 100 does not transfer energy from the gate capacitor Cg to the supply voltage source Vdd during the dead time and, as such, discharge time is increased when the dead time increases.

As apparent from the above description, in accordance with embodiments of the present disclosure, electrical energy supplied to the input stage of the power switching element during an ON state of the power switching element is again recovered during an OFF state of the power switching element.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A power supply comprising:
a power switching element;
a control circuit configured to output a control signal for controlling opening or closing of the power switching element; and
a gate drive circuit configured to open or close the power switching element in accordance with the control signal,
wherein the gate drive circuit comprises a first inductive circuit connected to a supply voltage source and a second inductive circuit connected to an input stage of the power switching element, and
the gate drive circuit is configured transfer electrical energy from the supply voltage source to the input stage of the power switching element using the first and second inductive circuits, and transfer electrical energy from the input stage of the power switching element to the supply voltage, source using the first and second inductive circuits.

2. The power supply according to claim 1, wherein the gate drive circuit further comprises a first switching circuit configured to control current flowing through the first inductive circuit, and a second switching circuit configured to control current flowing through the second inductive circuit.

3. The power supply according to claim 2, wherein the gate drive circuit adjusts ON durations of the first and second switching circuits, to adjust an energy transfer time for the energy transfer between the input stage of the power switching element and the supply voltage source.

4. The power supply according to claim 2, wherein the gate drive circuit is configured to turn on the second switching circuit after turning on the first switching circuit, for increasing a voltage at the input stage of the power switching element.

5. The power supply according to claim 4, wherein the gate drive circuit is configured to increase an ON-duration duty ratio of the first switching circuit in accordance with the increase of the input stage voltage of the power switching element.

6. The power supply according to claim 4, wherein the gate drive circuit is configured to decrease an ON-duration duty ratio of the second switching circuit in accordance with the increase of the input stage voltage of the power switching element.

7. The power supply according to claim 2, wherein the gate drive circuit is configured to turn on the first switching circuit after turning on the second switching circuit, for decreasing a voltage at the input stage of the power switching element.

8. The power supply according to claim 7, wherein the gate drive circuit is configured to increase an ON-duration duty ratio of the second switching circuit in accordance with the decrease of the input stage voltage of the power switching element.

9. The power supply according to claim 7, wherein the gate drive circuit is configured to decrease an ON-duration duty ratio of the first switching circuit in accordance with the decrease of the input stage voltage of the power switching element.

10. The power supply according to claim 2, wherein the gate drive circuit further comprises a switching signal generator configured to generate a first switching signal for opening or closing of the first switching circuit and a second switching signal for opening or closing of the second switching circuit in accordance with the control signal.

11. The power supply according to claim 10, wherein the switching signal generator is configured to output the second switching signal for turning-on of the second switching circuit after outputting the first switching signal for turning-on of the first switching circuit, upon receiving an ON signal for the power switching element.

12. The power supply according to claim 11, wherein the switching signal generator is configured to reduce an ON duration of the second switching signal in accordance with the increase of the input stage voltage of the power switching element.

13. The power supply according to claim 10, wherein the switching signal generator is configured to output the first switching signal for turning-on of the first switching circuit after outputting the second switching signal for turning-on of the second switching circuit, upon receiving an OFF signal for the power switching element.

14. The power supply according to claim 13, wherein the switching signal generator is configured to increase an ON duration of the second switching signal in accordance with the decrease of the input stage voltage of the power switching element.

15. A gate driver for opening or closing a power switching element, comprising:
a first inductive circuit connected to a supply voltage source;
a second inductive circuit connected to an input stage of the power switching element;
a switching circuit configured to control current flowing through the first and second inductive circuits; and
a switching signal generator configured to control the switching circuit to transfer electrical energy from the supply voltage source to the input stage of the power switching element using the first and second inductive circuits and transfer electrical energy from the input stage of the power switching element to the supply voltage source using the first and second inductive circuits.

16. The gate driver according to claim 15, wherein the switching circuit comprises a first switching circuit configured to control current flowing through the first inductive circuit, and a second switching circuit configured to control current flowing through the second inductive circuit.

17. The gate driver according to claim 16, wherein the switching signal generator is configured to adjust ON durations of the first and second switching circuits, in order to adjust an energy transfer time for the energy transfer between the input stage of the power switching element and the supply voltage source.

18. The gate driver according to claim 16, wherein the switching signal generator is configured to output a second switching signal for turning-on of the second switching circuit after outputting a first switching signal for turning-on of the first switching circuit, upon receiving an ON signal for the power switching element.

19. The gate driver according to claim 18, wherein the switching signal generator is configured to reduce an ON duration of the second switching signal in accordance with the increase of the input stage voltage of the power switching element.

20. The gate driver according to claim 16, wherein the switching signal generator is configured to output a first switching signal for turning-on of the first switching circuit after outputting a second switching signal for turning-on of the second switching circuit, upon receiving an OFF signal for the power switching element.

21. The gate driver according to claim 20, wherein the switching signal generator is configured to increase an ON duration of the second switching signal in accordance with the decrease of the input stage voltage of the power switching element.

22. An apparatus comprising:
a load; and
a power supply providing power to the load, the power supply comprising:
a DC-DC converter comprising:
a power switching element;
a control circuit configured to output a control signal; and
a gate drive circuit configured to open or close the power switching element based on the control signal,
wherein the gate drive circuit comprises a first inductive circuit connected to a supply voltage source and a second inductive circuit connected to an input stage of the power switching element, and
the gate drive circuit is configured transfer electrical energy from the supply voltage source to the input stage of the power switching element using the first and second inductive circuits, and transfer electrical energy from the input stage of the power switching element to the supply voltage source using the first and second inductive circuits.

* * * * *